United States Patent
Hayashi

(10) Patent No.: US 8,042,014 B2
(45) Date of Patent: Oct. 18, 2011

(54) SEMICONDUCTOR APPARATUS AND METHOD OF DISPOSING OBSERVATION FLIP-FLOP

(75) Inventor: Masahiko Hayashi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 731 days.

(21) Appl. No.: 11/797,589

(22) Filed: May 4, 2007

(65) Prior Publication Data

US 2007/0283203 A1 Dec. 6, 2007

(30) Foreign Application Priority Data

May 10, 2006 (JP) .................................. 2006-131977

(51) Int. Cl.
- *G01R 31/28* (2006.01)
- *G01R 27/28* (2006.01)
- *G01R 31/00* (2006.01)
- *G01R 31/14* (2006.01)
- *G01L 15/00* (2006.01)
- *G06F 11/22* (2006.01)
- *G06F 17/50* (2006.01)

(52) U.S. Cl. ........ 714/724; 714/726; 714/272; 714/729; 702/117; 702/118; 702/121; 716/136

(58) Field of Classification Search ................... 365/201
See application file for complete search history.

(56) References Cited

U.S. PATENT DOCUMENTS

| | | | | |
|---|---|---|---|---|
| 5,416,784 A * | 5/1995 | Johnson | .................... | 714/733 |
| 5,570,375 A * | 10/1996 | Tsai et al. | .................... | 714/727 |
| 5,592,493 A * | 1/1997 | Crouch et al. | .................... | 714/729 |
| 5,710,779 A * | 1/1998 | Whetsel | .................... | 714/726 |
| 6,430,718 B1 * | 8/2002 | Nayak | .................... | 714/727 |
| 2004/0015788 A1 * | 1/2004 | Huang et al. | .................... | 716/1 |
| 2004/0250165 A1 * | 12/2004 | Tanizaki | .................... | 714/30 |
| 2005/0055615 A1 * | 3/2005 | Agashe et al. | .................... | 714/727 |
| 2006/0005103 A1 * | 1/2006 | Zhang et al. | .................... | 714/758 |
| 2007/0016834 A1 * | 1/2007 | Debnath et al. | .................... | 714/726 |
| 2007/0260954 A1 * | 11/2007 | Wong | .................... | 714/733 |

FOREIGN PATENT DOCUMENTS

| JP | 9-145785 A | 6/1997 |
|---|---|---|
| JP | 2000-275304 A | 10/2000 |
| JP | 2006-58273 | 3/2006 |

OTHER PUBLICATIONS

Japanese Patent Application No. 2006-131977 Office Action dated Nov. 24, 2010, with partial English translation.

* cited by examiner

*Primary Examiner* — Jeffrey A Gaffin
*Assistant Examiner* — Guerrier Merant
(74) *Attorney, Agent, or Firm* — McGinn Intellectual Property Law Group, PLLC

(57) ABSTRACT

A semiconductor apparatus includes a functional block to observe a state of a signal line in the apparatus. The functional block includes a signal transfer section to receive, transmit and output the state of the signal line, and an observation flip-flop to store a state of an input terminal or an output terminal of the signal transfer section.

16 Claims, 6 Drawing Sheets

SEMICONDUCTOR APPARATUS AND METHOD OF DISPOSING OBSERVATION FLIP-FLOP

BACKGROUND OF THE INVENTION

1. Field of the Invention

The present invention relates to a semiconductor apparatus and a method of disposing an observation flip-flop. Particularly, the present invention relates to a semiconductor apparatus and a method of disposing an observation flip-flop which suppress an increase in line capacitance due to the addition of an observation flip-flop.

2. Description of Related Art

A circuit of a semiconductor apparatus is recently increasing in size. A semiconductor apparatus usually undergoes a short-circuit test of a signal line in the apparatus. However, as a circuit size increases, a connection of signal lines in an internal circuit becomes complex, which makes it unable to keep track of the state of signal lines in an internal circuit through an external terminal of the semiconductor apparatus. To address this, recent semiconductor apparatus employ a scan chain circuit, which is composed of observation flip-flops connected in series, as a test circuit to keep track of the state of signal lines upon delivery inspection. A technique that uses such a scan chain circuit is disclosed in Japanese Unexamined Patent Application Publication No. 2006-58273, which is referred to hereinafter as the related art.

FIG. 7 is a circuit diagram of a semiconductor apparatus 100 which is disclosed in the related art. As shown in FIG. 7, the semiconductor apparatus 100 includes input/output terminals 101A and 101B, a combinational circuit 102, observation flip-flops $103_1$ to $103_{m+n}$, and selectors 104 to 109. In the semiconductor apparatus 100, the state of signal lines in the combinational circuit 102 is captured by the observation flip-flops $103_1$ to $103_{m+n}$. The captured data is output from the input/output terminals 101A and 101B. In the semiconductor apparatus 100, a scan chain circuit is divided into a scan chain circuit which is composed of the observation flip-flops $103_1$ to $103_m$ and a scan chain circuit which is composed of the observation flip-flops $103_{m+1}$ to $103_{m+n}$, thereby reducing the length of each scan chain circuit. It is thereby possible to reduce the number of clocks required from data capture to data output and also reduce a time period required from data capture to data output.

In the semiconductor apparatus, an observation flip-flop is generally disposed in a free space within a chip. Thus, an observation flip-flop may be placed in a position away from a signal line whose state is to be observed. If an observation flip-flop and a signal line to be observed are connected through a long line, parasitic capacitance of the line is added to parasitic capacitance of the signal line to be observed. The parasitic capacitance of a signal line to be observed thereby increases due to the insertion of an observation flip-flop.

Recent semiconductor apparatus have a low operating power supply voltage to achieve lower power consumption. A decrease in operating power supply voltage generally leads to a decrease in current supply capacity of elements that form an internal circuit. If large capacitance is connected to the output of those elements in such a condition, the delay of an output signal increases. In short, the placement of an observation flip-flop, which is added to improve the reliability of a semiconductor apparatus, causes an increase in parasitic capacitance of a signal line, which leads to an increase in signal delay in an internal circuit. This can cause malfunction of the semiconductor apparatus.

SUMMARY

In one embodiment of the present invention, there is provided a semiconductor apparatus including a functional block to observe a state of a signal line in the semiconductor apparatus, the functional block including a signal transfer section to receive, transmit and output the state of the signal line, and an observation flip-flop to store a state of an input terminal or an output terminal of the signal transfer section In the semiconductor apparatus according to the embodiment of the present invention, the observation flip-flop observes the state of a signal line by storing the state of the input terminal or the output terminal of the signal transfer section. Because the observation flip-flop and the signal transfer section are placed in the same functional block, a line length between the signal line and the observation flip-flop is short. Therefore, the use of the functional block of the present invention as an observation flip-flop enables significant reduction in parasitic capacitance of a line from the signal line to the observation flip-flop. It is thereby possible to suppress an increase in signal delay due to the addition of the observation flip-flop, thus preventing malfunction of the semiconductor apparatus.

In another embodiment of the present invention, there is provided a method of disposing an observation flip-flop to observe a state of a signal line in a semiconductor apparatus, including placing the observation flip-flop as a functional block including a signal transfer section to receive, transmit and output the state of the signal line and an observation flip-flop to store a state of an input terminal or an output terminal of the signal transfer section, and connecting the signal line through the signal transfer section.

In the method of disposing an observation flip-flop according to the aspect of the present invention, the signal transfer section which outputs the state of the signal line and the observation flip-flop are placed as one functional block. Further, the state of the signal line is stored in the observation flip-flop in accordance with the state of the input terminal or the output terminal of the signal transfer section. This shortens a distance between the observation flip-flop and the signal line to thereby suppress an increase in signal line due to the addition of the observation flip-flop. It is thereby possible to avoid an increase in parasitic capacitance in the signal line, thus suppressing an increase in signal delay in the semiconductor apparatus and preventing malfunction of the semiconductor apparatus.

The semiconductor apparatus and the method of disposing an observation flip-flop according to the present invention can suppress an increase in line capacitance due to the addition of an observation flip-flop.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
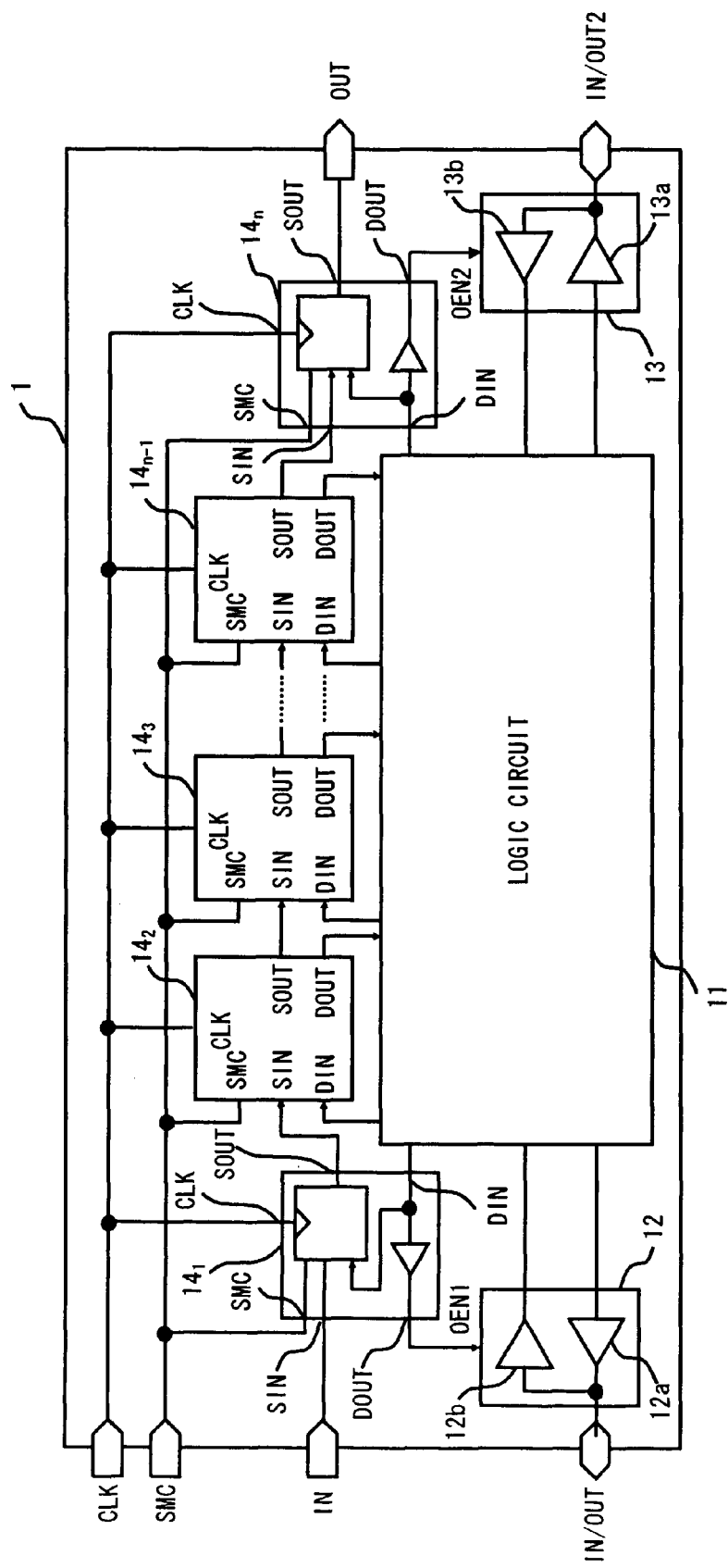
FIG. 1 is a block diagram of a semiconductor apparatus according to a first embodiment of the present invention.

Exemplary embodiments of the present invention are described hereinafter with reference to the drawings. FIG. 1 is a block diagram of a semiconductor apparatus 1 according to a first embodiment of the present invention. As shown in FIG. 1, the semiconductor apparatus 1 includes a logic circuit 11, input/output buffers 12 and 13, and functional blocks $14_1$ to $14_n$.

The logic circuit 1 serves as an information processing unit of the semiconductor apparatus 1, and functional circuits to be used by a user are formed in the logic circuit 1. The input/output buffer 12 includes an output buffer 12a and an input buffer 12b, and the input/output buffer 13 includes an output buffer 13a and an input buffer 13b. The input/output buffers 12 and 13 are buffer circuits capable of switching between an input mode and an output mode according to a switch signal OEN. In normal operation mode, the semiconductor apparatus 1 uses these blocks to exchange data with the outside and processes the exchanged data in the logic circuit 11.

The functional blocks $14_1$ to $14_n$ are used as observation flip-flops to observe the state of a signal line of the semiconductor apparatus 1 in this embodiment. The functional blocks $14_1$ to $14_n$ have a function to transmit the state of a signal line from an input terminal DIN to an output terminal DOUT without storing it. The functional blocks $14_1$ to $14_n$ are described in detail later.

The functional block $14_1$ is inserted into the signal line that transmits a switch signal OEN1, which is output from the logic circuit 11 and input to the input/output buffer 12. The functional blocks $14_2$ to $14_{n-1}$ are inserted into the signal lines inside the logic circuit 11. The functional block $14_n$ is inserted into the signal line that transmits a switch signal OEN2, which is output from the logic circuit 11 and input to the input/output buffer 13. If the functional blocks $14_1$ to $14_n$ are inserted into the signal lines, a data input terminal DIN of a functional block is connected with a transmitting end to transmit a signal through the signal line, and a data output terminal DOUT is connected with a receiving end to receive a signal through the signal line.

The functional blocks $14_1$ to $14_n$ are connected in series. For example, a shift signal input terminal SIN of the functional block $14_1$, which is placed in the first stage, is connected with a test signal input terminal IN. The functional blocks $14_2$ to $14_n$ are sequentially connected in the subsequent stages of the functional block $14_1$. Shift signal input terminals SIN of the functional blocks $14_2$ to $14_n$ are respectively connected with shift signal output terminals SOUT of the functional blocks in the previous stage. The shift signal output terminal SOUT of the functional block $14_n$, which is placed in the final stage, is connected with a test signal output terminal OUT.

Further, the functional blocks $14_1$ to $14_n$ operate in accordance with a test clock CLK, and they change an operation mode in accordance with a scan mode control signal SMC. For example, if the scan mode control signal SMC is High level, which is referred to hereinafter as a first mode (e.g. capture mode), a functional block stores the state of the signal line which is connected with the data input terminal DIN. If, on the other hand, the scan mode control signal SMC is Low level, which is referred to hereinafter as a second mode (e.g. shift mode), a functional block transmits the stored data to the functional block which is connected in the next stage in accordance with a test clock signal CLK. Thus, each functional block stores the state of a signal line during the scan mode and outputs the stored state of the signal during the shift mode.

Figure 2:
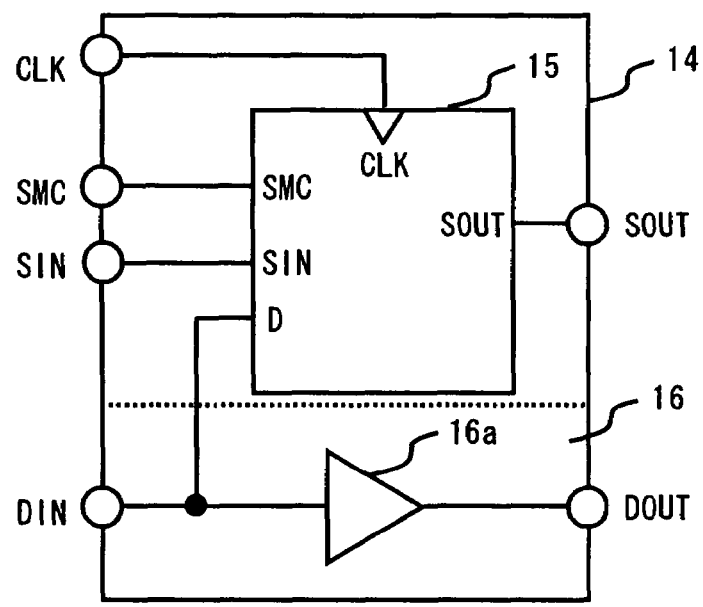
FIG. 2 is a circuit diagram of a functional block according to the first embodiment of the present invention.

The functional blocks $14_1$ to $14_n$ are described hereinafter in detail. Because the functional blocks $14_1$ to $14_n$ have the same configuration, they are collectively described as a functional block 14 in the following explanation. FIG. 2 is a circuit diagram of the functional block 14. As shown in FIG. 2, the functional block 14 includes an observation flip-flop 15 and a signal transfer section 16.

The observation flip-flop 15 includes a first input terminal (e.g. an observation value input terminal D), a second input terminal (e.g. a shift signal input terminal SIN), an input terminal to which a scan mode control signal SMC is input, an input terminal to which a test clock CLK is input, and a shift signal output terminal SOUT. The signal transfer section 16 includes a data input terminal DIN, a data output terminal DOUT, and a buffer 16a.

The observation value input terminal D of the observation flip-flop 15 is connected with the data input terminal DIN of the signal transfer section 16. The shift signal input terminal SIN of the observation flip-flop 15 is connected with the shift signal output terminal SOUT of another functional block. The shift signal output terminal SOUT is an output terminal of the functional block 14, and the data stored in the observation flip-flop 15 is output through it. The input of the buffer 16a is connected with the data input terminal DIN of the signal transfer section 16, and the output is connected with the output terminal DOUT. The buffer 16a outputs from the output terminal DOUT the state of a signal which is input to the data input terminal DIN without making any change. The buffer 16a drives the line and the element which are connected at the side of the output terminal DOUT.

The observation flip-flop 15 stores the state of the data input terminal DIN during the capture mode. During the shift mode, on the other hand, the observation flip-flop 15 receives the data which is stored in the functional block in the previous stage and stores the data. These operations are carried out in synchronization with the test clock CLK.

There are various kinds of scan tests depending on a control method of the capture mode or the shift mode. Thus, the configuration of the observation flip-flop of the functional block is not limited to that described in this embodiment but may be selected appropriately according to the scan test. The buffer of the signal transfer section 16 may be an inverting circuit in accordance with the logic of a signal which is transmitted through a signal line. Alternatively, the data input terminal DIN and the output terminal DOUT may be connected simply through a line having a prescribed length in order to reduce the layout area. The observation value input terminal D of the observation flip-flop may be connected with the data output terminal of the signal transfer section.

Figure 3:
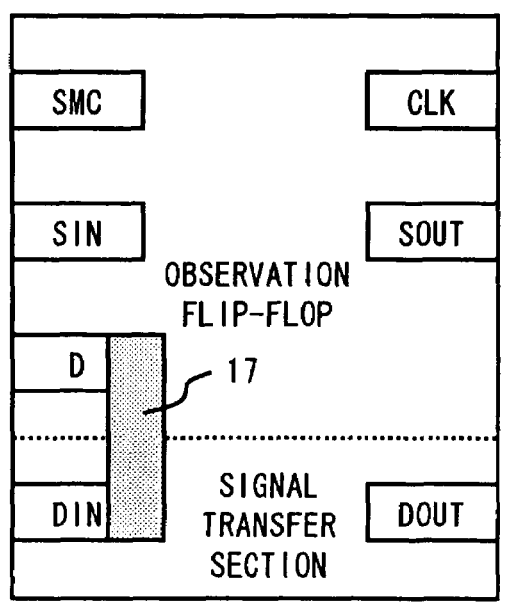
FIG. 3 is a schematic view of a layout cell of the functional block according to the first embodiment of the present invention.

The functional block 14 is disposed as one layout unit (e.g. a layout cell) when it is disposed in a semiconductor apparatus. FIG. 3 is a schematic view of the layout cell of the functional block 14. As shown in FIG. 3, the layout cell of the functional block 14 includes an area where an observation flip-flop is disposed and an area where a signal transfer section is disposed. A specific arrangement of elements in the layout cell is not illustrated in FIG. 3. The layout cell of the functional block 14 includes terminals corresponding to the terminals of the functional block 14. On the layout cell, the observation value input terminal D and the data input terminal DIN are connected by a metal line 17.

Figure 4:
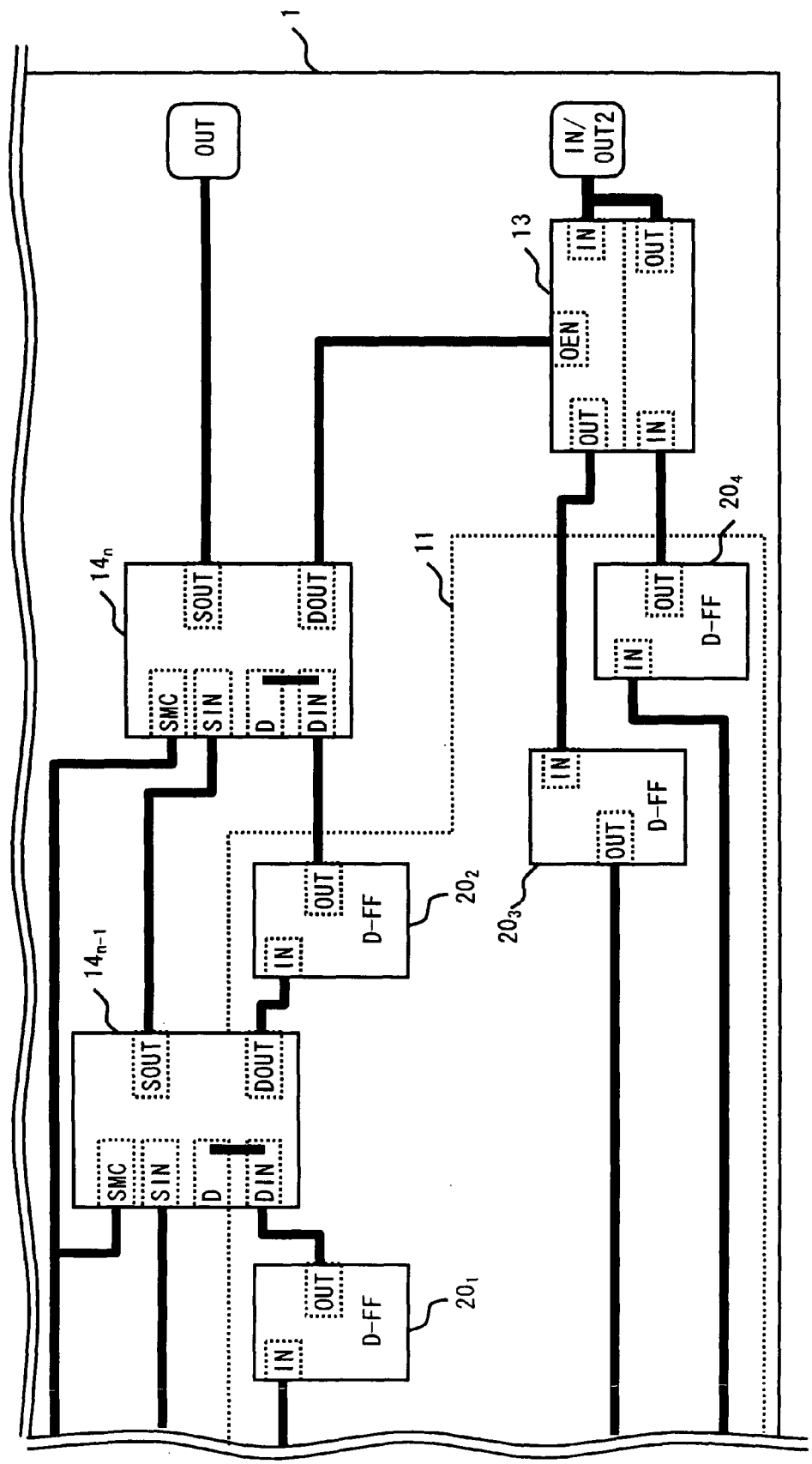
FIG. 4 is a view showing an example of a layout of the semiconductor apparatus according to the first embodiment of the present invention.

FIG. 4 is a schematic view of the layout to produce the semiconductor apparatus 1 shown in FIG. 1 by using the layout cell of the functional block 14 shown in FIG. 3. Lines and terminals for a test clock are not illustrated in FIG. 4 for simplification. FIG. 4 shows a part of the semiconductor apparatus 1 shown in FIG. 1, which includes the input/output buffer 13 and its vicinity.

As shown in FIG. 4, the logic circuit 11 includes D-type flip-flops $20_1$ to $20_4$. The functional block $14_{n-1}$ is inserted between the D-type flip-flop $20_1$ and the D-type flip-flop $20_2$. The functional block $14_n$ is inserted between the D-type flip-flop $20_2$ and the input terminal of the switch signal OEN of the input/output buffer 13.

As described above, the semiconductor apparatus of this embodiment can dispose an observation flip-flop within the semiconductor apparatus by placing the functional block 14 as a layout cell. The functional block is disposed as one layout cell. Thus, lines in the functional block are significantly shorter than a signal line to be observed. Therefore, disposing a functional block as a layout cell suppresses an increase in line due to the addition of observation flip-flops to a negligible level. Because the line length between a signal line and an observation flip-flop is short, it is possible to prevent an increase in line capacity which occurs due to the addition of observation flip-flops.

Further, the semiconductor apparatus of this embodiment places a buffer in the signal transfer section of each functional block. A signal through a signal line is thus transferred via the buffer, which shortens a signal line length. This reduces a load on a transmitting end that outputs the signal to the signal line. It is thereby possible to reduce a signal delay which is caused by the signal line.

Figure 5:
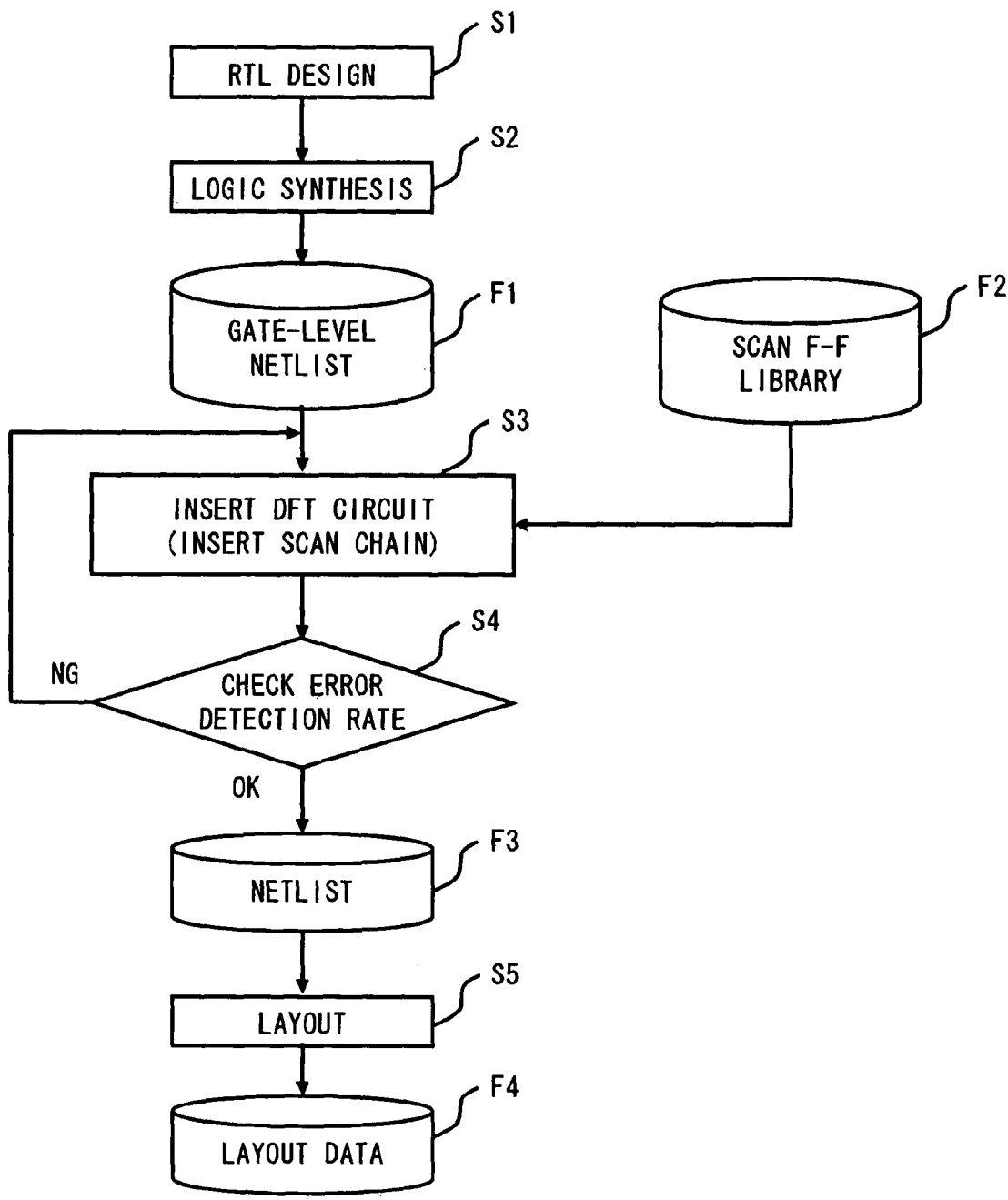
FIG. 5 is a flowchart showing a design flow of the semiconductor apparatus according to the first embodiment of the present invention.

A process flow to dispose the functional block 14 in the semiconductor apparatus is described hereinafter. FIG. 5 is a flowchart showing an example of a design flow of the semiconductor apparatus. As shown in FIG. 5, an RTL (Register Transfer Level) design is performed first in the design process of the semiconductor apparatus (Step S1). The RTL design is a design technique that represents a circuit by flip-flops and a combinational circuit using a hardware description language. Then, logic synthesis is performed on the circuit described by the RTL design (Step S2). In the logic synthesis, a gate-level circuit in which circuit elements are connected on the basis of the hardware description language is generated. Based on the result of the logic synthesis, a gate-level netlist F1 is generated. The netlist is a file that describes a connection among circuit elements.

After that, a DFT (Design For Test) circuit is inserted into the gate-level netlist (Step S3). The DFT circuit is a scan chain circuit in which the above-described observation flip-flop, which is inserted into a signal line to be observed, is connected. Thus, the above-described observation flip-flop is inserted appropriately into the circuit in Step S3. The observation flip-flop is inserted as layout cell data which is registered in a scan flip-flop library F2 or the like. The process of Step S3 is performed using an arithmetic unit such as a computer.

After completing Step S3, the number of defective portions which can be detected by the DFT circuit out of predicted defective portions for the circuit is calculated to check an error detection rate (Step S4). In Step S4, an error detection rate is calculated by generating a test signal using an ATPG (Automatic Test Pattern Generation) tool or the like. If the check result in Step S4 does not satisfy a predetermined error detection rate, the process returns to Step S3 to redesign the DFT circuit. On the other hand, if the check result in Step S4 satisfies a predetermined error detection rate, a netlist F3, in which a DFT circuit is added to the gate-level netlist F1, is output. Based on the netlist F3, the layout of circuit element pattern is performed in Step S5. As a result, layout data F4, which is mask data to manufacture semiconductor apparatus, is generated.

As described in the foregoing, the design flow of the semiconductor apparatus according to this embodiment uses a functional block which is registered as a layout cell to generate a DFT circuit in the process of inserting the DFT circuit. This enables the use of the functional block instead of a normal observation flip-flop. The DFT circuit using the functional block can suppress an increase in line due to the addition of observation flip-flops.

Second Embodiment

A semiconductor apparatus according to a second embodiment of the present invention is substantially the same as the semiconductor apparatus according to the first embodiment. However, the first embodiment and the second embodiment are different in the way of inserting a functional block. In the first embodiment, a scan chain circuit which uses a functional block is generated in the process of inserting a DFT circuit. In the second embodiment, on the other hand, a functional block is used only in a predetermined position.

Figure 6:
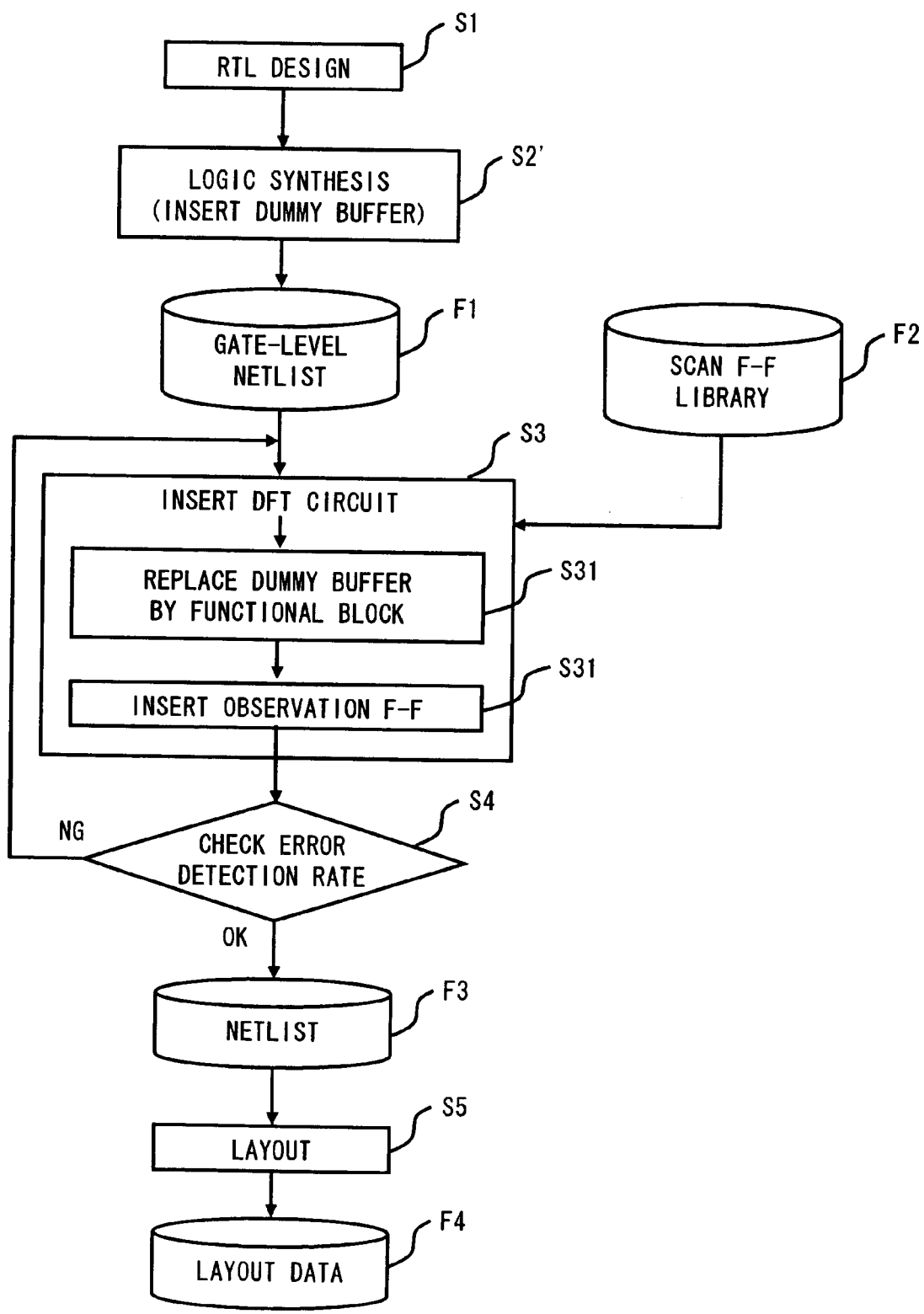
FIG. 6 is a flowchart showing a design flow of a semiconductor apparatus according to a second embodiment of the present invention.
Figure 7:
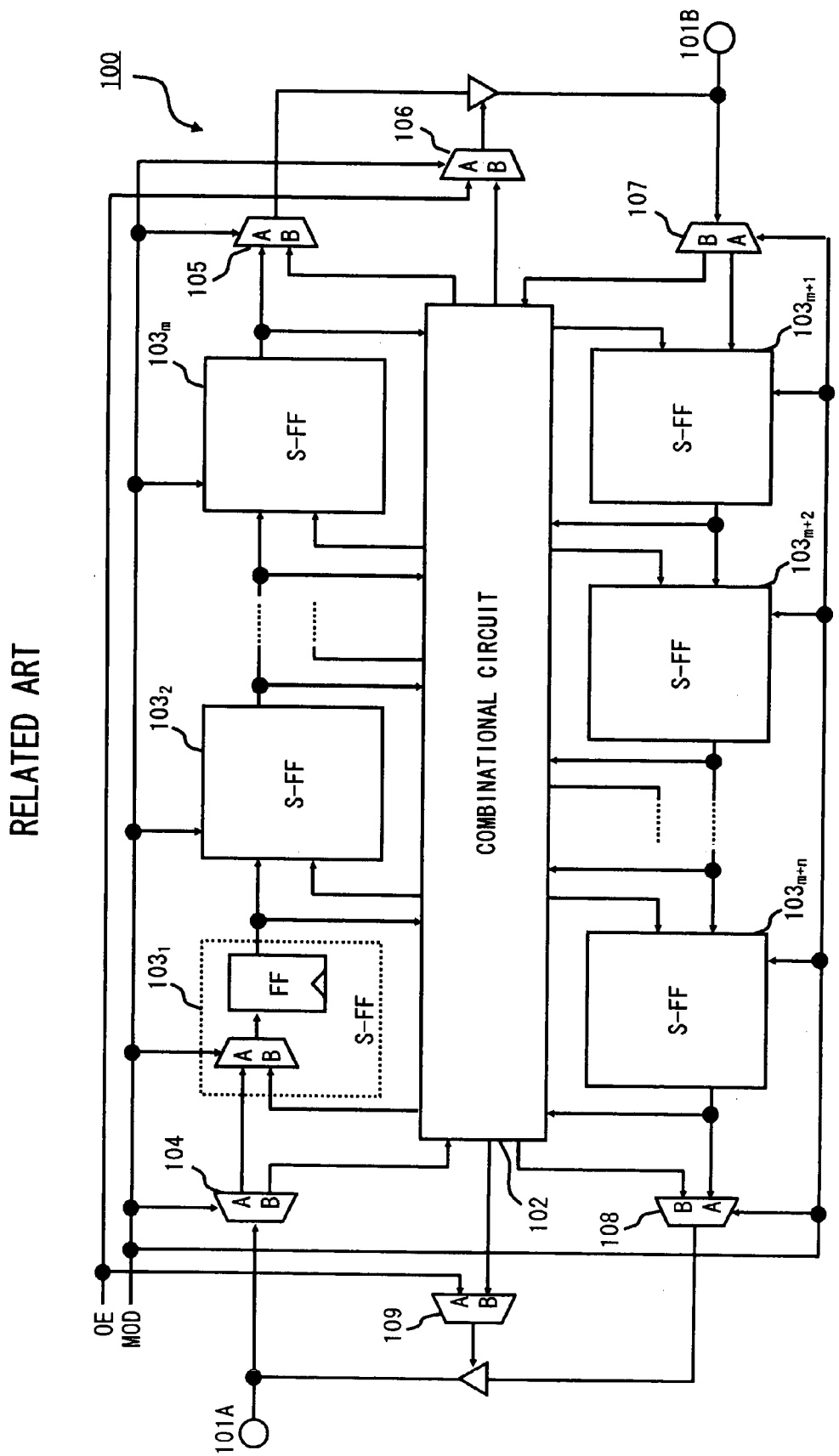
FIG. 7 is a block diagram of a semiconductor apparatus according to a related art.

FIG. 6 is a flowchart showing a design flow of the semiconductor apparatus according to the second embodiment. As shown in FIG. 6, the design flow of the second embodiment also begins with the RTL design (Step S1). Then, logic synthesis is performed on the basis of the description of the RTL design (Step S2'). In the second embodiment, a dummy buffer is inserted in Step S2' into a signal line which, according to verification in the design phase, does not have an enough margin for signal delay with respect to a prescribed specification value (e.g. a timing constraint). The dummy buffer is a delay adjustment element to adjust a signal delay time, and it is replaced by a functional block in the process of inserting a DFT circuit as described later. After the logic synthesis, a gate-level netlist F1 is generated.

Then, a DFT circuit is inserted into the gate-level netlist F1. In this embodiment, the DFT circuit is generated by two steps.

First, the dummy buffer which is disposed in Step S2' is replaced by a functional block in Step S31. Then, in Step S32, an observation flop-flop is disposed in a signal line where no dummy buffer is connected and observation is needed. After that, a scan chain circuit in which the functional block and the observation flip-flop are connected is generated. In this embodiment as well, the functional block and the observation flip-flop use the layout cell which is registered in a scan flip-flop library F2 or the like. The subsequent process is the same as that in the first embodiment and thus not described herein.

As described in the foregoing, according to the design flow of the semiconductor apparatus of the second embodiment, a functional block is inserted only into a signal line which does not have an enough margin for signal delay with respect to a timing constraint. For the line which can allow for some signal delay, a normal observation flip-flop is disposed. Because the functional block is composed of a signal transfer section and an observation flip-flop which are integrated in one layout cell, the layout area is larger than the layout cell which is composed of an observation flip-flop only. The design flow of the semiconductor apparatus of the second embodiment places a functional block only in the portion where parasitic capacitance of a signal line should be suppressed, thereby reducing the chip area compared with that in the first embodiment.

It is apparent that the present invention is not limited to the above embodiment but may be modified and changed without departing from the scope and spirit of the invention. For example, in the design flow, the process of inserting a functional block and an observation flip-flop may be performed after timing verification upon completion of the layout. The functional block and the observation flip-flop may be inserted in any step which allows circuit modification.

What is claimed is:

1. A semiconductor apparatus comprising:
    a functional block to observe a state of a signal line in the semiconductor apparatus, the functional block including:
        a signal transfer section to receive, transmit and output the state of the signal line; and
        an observation flip-flop including an input terminal connected to anyone of an input terminal of the signal transfer section and an output terminal of the signal transfer section, an output terminal of the observation flip-flop being provided separately from the output terminal of the signal transfer section, the observation flip-flop storing a state of a terminal to which the input terminal is connected.

2. The semiconductor apparatus according to claim 1, wherein
    the functional block is disposed as one layout unit in the semiconductor apparatus.

3. The semiconductor apparatus according to claim 1, wherein
    the signal transfer section includes a buffer or an inverter.

4. The semiconductor apparatus according to claim 1, wherein
    the observation flip-flop includes a first input terminal connected with the input terminal or the output terminal of the signal transfer section, and a second input terminal connected with an output of another observation flip-flop, and
    the observation flip-flop stores a state input to the first input terminal during a first mode and stores a state of the second input terminal during a second mode.

5. A method of disposing an observation flip-flop to observe a state of a signal line path in a semiconductor apparatus, comprising:
    placing the observation flip-flop as a functional block including a signal transfer section to receive, transmit and output a state of the signal line and an observation flip-flop including an input terminal connected to any one of an input terminal of the signal transfer section and an output terminal of the signal transfer section, an output terminal of the observation flip-flop being provided separately from the output terminal of the signal transfer section, the observation flip-flop storing a state of a terminal to which the input terminal is connected; and
    connecting the signal line path through the signal transfer section.

6. The method of disposing an observation flip-flop according to claim 5,
    wherein the functional block is disposed as one layout unit in the semiconductor apparatus.

7. The method of disposing an observation flip-flop according to claim 5,
    wherein the signal transfer section includes a buffer or an inverter.

8. The method of disposing an observation flip-flop according to claim 5,
    wherein the functional block replaces a pre-placed signal delay adjustment element to adjust a signal delay time.

9. The method of disposing an observation flip-flop according to claim 6,
    wherein the functional block replaces a pre-placed signal delay adjustment element to adjust a signal delay time.

10. The semiconductor apparatus according to claim 1,
    wherein the stored state of the input terminal or the output terminal of the signal transfer section from the observation flip-flop is outputted to the output terminal of the observation flip-flop from the functional block while the signal transfer section outputs the state of the signal line path to the output terminal without passing through the observation flip-flop.

11. The semiconductor apparatus according to claim 1,
    wherein the observation flip-flop outputs a stored state of the signal line path within the semiconductor apparatus and the transfer section outputs the state of the signal line path without being stored in the observation flip-flop.

12. A semiconductor apparatus comprising:
    a plurality of functional blocks, each to observe a state of a signal line in the semiconductor apparatus, each of the functional blocks comprising:
        a signal transfer section to receive and output the state of the signal line; and
        an observation flip-flop to store a state of an input terminal or an output terminal of the signal transfer section and to store a second input received by the functional block, wherein the signal transfer section outputs the state of the signal line path to the output terminal without passing through the observation flip-flop, and wherein the stored state of the input terminal or the output terminal of the signal transfer section from the observation flip-flop is outputted to a test signal output terminal exclusive from the output terminal receiving the state of the signal line path without passing through the observation flip-flop.

13. The semiconductor apparatus according to claim 1, wherein the signal transfer section outputs the state of the signal line path to the output terminal of the signal transfer section without passing through the observation flip-flop during a scan mode and a shift mode of the observation flip-flop.

14. The semiconductor apparatus according to claim 1, wherein the signal transfer section outputs without any change of the state of the signal line path to the output terminal of the signal transfer section without passing through the observation flip-flop.

15. The semiconductor apparatus according to claim 1, wherein the signal transfer section outputs the state of the signal line path to the output terminal of signal transfer section without passing through the observation flip-flop during any period of time to observe the state of the signal line path.

16. The semiconductor apparatus according to claim 1, wherein the stored state of the input terminal or the output terminal of the signal transfer section from the observation flip-flop is outputted to a test signal output terminal of each of the functional blocks, separate from the output terminal of the signal transfer section.

* * * * *